US007853916B1

(12) United States Patent
Trimberger et al.

(10) Patent No.: US 7,853,916 B1
(45) Date of Patent: Dec. 14, 2010

(54) METHODS OF USING ONE OF A PLURALITY OF CONFIGURATION BITSTREAMS FOR AN INTEGRATED CIRCUIT

(75) Inventors: Stephen M. Trimberger, San Jose, CA (US); Babak Ehteshami, Redwood City, CA (US)

(73) Assignee: Xilinx, Inc., San Jose, CA (US)

( * ) Notice: Subject to any disclaimer, the term of this patent is extended or adjusted under 35 U.S.C. 154(b) by 447 days.

(21) Appl. No.: 11/974,355

(22) Filed: Oct. 11, 2007

(51) Int. Cl.
*G06F 17/50* (2006.01)
*H03K 19/00* (2006.01)
*H03K 17/693* (2006.01)

(52) U.S. Cl. .................... 716/16; 716/1; 716/4; 716/5; 716/6; 716/9; 716/10; 716/17; 716/18

(58) Field of Classification Search .............. 716/1, 716/2, 6, 10, 16, 17, 18
See application file for complete search history.

(56) References Cited

U.S. PATENT DOCUMENTS

| 4,698,760 | A |   | 10/1987 | Lembach et al. |        |
|-----------|---|---|---------|----------------|--------|
| 4,899,067 | A |   | 2/1990  | So et al.      |        |
| 5,153,880 | A |   | 10/1992 | Owen et al.    |        |
| 5,255,227 | A |   | 10/1993 | Haeffele       |        |
| 5,349,248 | A |   | 9/1994  | Goetting et al.|        |
| 5,430,734 | A |   | 7/1995  | Gilson         |        |
| 5,434,514 | A |   | 7/1995  | Cliff et al.   |        |
| 5,459,342 | A |   | 10/1995 | Nogami et al.  |        |
| 5,485,102 | A |   | 1/1996  | Cliff et al.   |        |
| 5,498,975 | A |   | 3/1996  | Cliff et al.   |        |
| 5,513,144 | A |   | 4/1996  | O'Toole        |        |
| 5,521,837 | A | * | 5/1996  | Frankle et al. | 716/10 |
| 5,581,738 | A | * | 12/1996 | Dombrowski     | 716/16 |
| 5,592,102 | A |   | 1/1997  | Lane et al.    |        |
| 5,659,484 | A | * | 8/1997  | Bennett et al. | 716/16 |
| 5,689,516 | A |   | 11/1997 | Mack et al.    |        |
| 5,742,556 | A |   | 4/1998  | Tavrow et al.  |        |
| 5,761,483 | A |   | 6/1998  | Trimberger     |        |
| 5,764,577 | A |   | 6/1998  | Johnston et al.|        |
| 5,777,887 | A |   | 7/1998  | Marple et al.  |        |

(Continued)

OTHER PUBLICATIONS

U.S. Appl. No. 10/714,380; filed Oct. 31, 2003 by Trimberger.

(Continued)

*Primary Examiner*—Helen Rossoshek
(74) *Attorney, Agent, or Firm*—John J. King

(57) ABSTRACT

Methods of using one of a plurality of configuration bitstreams in an integrated circuit are disclosed. An exemplary method comprises analyzing the plurality of implementations of a design to determine initial variations in timing among the implementations; modifying the implementations to reduce the variations in timing among the implementations; and outputting a plurality of configuration bitstreams for the implementations having variations in timing that are reduced relative to the initial variations in timing. Another method comprises generating a plurality of implementations for the design; generating a cost function for the design based upon costs (e.g., collision penalties) derived from at least two of the plurality of implementations; determining a cost for each implementation based upon the cost function; optimizing an implementation of the design by minimizing the cost of the implementation; generating a plurality of configuration bitstreams for the plurality of implementations; and outputting the plurality of configuration bitstreams.

20 Claims, 9 Drawing Sheets

U.S. PATENT DOCUMENTS

| | | | |
|---|---|---|---|
| 5,796,750 | A | 8/1998 | Lottridge et al. |
| 5,925,920 | A | 7/1999 | MacArthur et al. |
| 5,931,959 | A | 8/1999 | Kwiat |
| 5,963,463 | A | 10/1999 | Rondeau, II et al. |
| 5,991,215 | A | 11/1999 | Brunelle |
| 5,996,096 | A | 11/1999 | Dell et al. |
| 6,003,150 | A | 12/1999 | Stroud et al. |
| 6,028,445 | A | 2/2000 | Lawman |
| 6,107,821 | A | 8/2000 | Kelem et al. |
| 6,150,839 | A | 11/2000 | New et al. |
| 6,166,559 | A | 12/2000 | McClintock et al. |
| 6,167,558 | A | 12/2000 | Trimberger |
| 6,172,520 | B1 | 1/2001 | Lawman et al. |
| 6,172,521 | B1 | 1/2001 | Motomura |
| 6,201,404 | B1 | 3/2001 | Reddy et al. |
| 6,202,182 | B1 | 3/2001 | Abramovici et al. |
| 6,247,147 | B1 | 6/2001 | Beenstra et al. |
| 6,279,146 | B1 | 8/2001 | Evans et al. |
| 6,289,292 | B1 | 9/2001 | Charlton et al. |
| 6,292,925 | B1 | 9/2001 | Dellinger et al. |
| 6,311,316 | B1 | 10/2001 | Huggins et al. |
| 6,326,806 | B1 | 12/2001 | Fallside et al. |
| 6,344,755 | B1 | 2/2002 | Reddy et al. |
| 6,366,117 | B1 | 4/2002 | Pang et al. |
| 6,496,971 | B1 | 12/2002 | Lesea et al. |
| 6,530,071 | B1 | 3/2003 | Guccione et al. |
| 6,560,740 | B1 | 5/2003 | Zuraski, Jr. et al. |
| 6,594,610 | B1 | 7/2003 | Toutounchi et al. |
| 6,606,729 | B2 | 8/2003 | Gross et al. |
| 6,618,686 | B2 | 9/2003 | Allamsetty |
| 6,664,808 | B2 | 12/2003 | Ling et al. |
| 6,668,237 | B1 | 12/2003 | Guccione et al. |
| 6,681,353 | B1 | 1/2004 | Barrow |
| 6,704,889 | B2 | 3/2004 | Veenstra et al. |
| 6,725,442 | B1 | 4/2004 | Cote et al. |
| 6,744,274 | B1 | 6/2004 | Arnold et al. |
| 6,748,456 | B1 | 6/2004 | Stanton et al. |
| 6,779,133 | B2 | 8/2004 | Whetsel |
| 6,807,631 | B2 | 10/2004 | Fuller et al. |
| 6,817,005 | B2 * | 11/2004 | Mason et al. ............... 716/16 |
| 6,817,006 | B1 | 11/2004 | Wells et al. |
| 6,839,792 | B2 | 1/2005 | Feldstein et al. |
| 6,864,710 | B1 | 3/2005 | Lacey et al. |
| 6,915,503 | B1 | 7/2005 | Lesea |
| 6,918,027 | B2 | 7/2005 | Mantey et al. |
| 6,924,663 | B2 | 8/2005 | Masui et al. |
| 6,925,407 | B2 | 8/2005 | Duppong |
| 6,961,884 | B1 | 11/2005 | Draper |
| 6,973,608 | B1 | 12/2005 | Abramovici et al. |
| 7,007,250 | B1 | 2/2006 | Bapat et al. |
| 7,045,472 | B2 | 5/2006 | Cooney et al. |
| 7,047,465 | B1 | 5/2006 | Trimberger |
| 7,071,679 | B1 | 7/2006 | Sabih et al. |
| 7,076,595 | B1 * | 7/2006 | Dao et al. ............... 710/317 |
| 7,080,300 | B1 | 7/2006 | Herron et al. |
| 7,089,466 | B2 | 8/2006 | Odom et al. |
| 7,124,391 | B1 * | 10/2006 | Patterson ............... 716/17 |
| 7,127,697 | B1 | 10/2006 | Wells et al. |
| 7,133,822 | B1 | 11/2006 | Jacobson |
| 7,143,378 | B1 * | 11/2006 | Nag ............... 716/6 |
| 7,146,598 | B2 | 12/2006 | Horanzy |
| 7,180,324 | B2 | 2/2007 | Chan et al. |
| 7,185,293 | B1 * | 2/2007 | Ofer ............... 716/1 |
| 7,185,295 | B2 | 2/2007 | Park et al. |
| 7,187,198 | B2 | 3/2007 | Akimichi |
| 7,187,597 | B1 | 3/2007 | Trimberger |
| 7,209,794 | B2 | 4/2007 | Duppong |
| 7,216,277 | B1 | 5/2007 | Ngai et al. |
| 7,219,278 | B2 | 5/2007 | Avery et al. |
| 7,227,364 | B1 | 6/2007 | Fan et al. |
| 7,228,521 | B1 | 6/2007 | Ma et al. |
| 7,233,532 | B2 | 6/2007 | Vadi et al. |
| 7,240,218 | B2 | 7/2007 | Kean |
| 7,249,010 | B1 | 7/2007 | Sundararajan et al. |
| 7,251,804 | B1 * | 7/2007 | Trimberger ............... 716/16 |
| 7,269,765 | B1 | 9/2007 | Charlton et al. |
| 7,284,159 | B2 | 10/2007 | Chakraborty et al. |
| 7,284,229 | B1 * | 10/2007 | Trimberger ............... 716/17 |
| 7,307,442 | B2 | 12/2007 | Ong |
| 7,362,135 | B1 * | 4/2008 | Chang ............... 326/47 |
| 7,363,560 | B1 | 4/2008 | Mark et al. |
| 7,392,498 | B1 * | 6/2008 | Srinivasan et al. ............... 716/16 |
| 7,412,635 | B1 * | 8/2008 | Trimberger ............... 714/725 |
| 7,424,655 | B1 * | 9/2008 | Trimberger ............... 714/725 |
| 7,469,394 | B1 | 12/2008 | Hutton et al. |
| 7,509,445 | B2 * | 3/2009 | Odom et al. ............... 710/58 |
| 7,512,922 | B1 * | 3/2009 | Stenz ............... 716/9 |
| 7,600,210 | B1 * | 10/2009 | Mason et al. ............... 716/16 |
| 7,610,573 | B1 * | 10/2009 | Chan et al. ............... 716/18 |
| 7,620,863 | B1 * | 11/2009 | Trimberger ............... 714/725 |
| 7,657,855 | B1 * | 2/2010 | Manaker et al. ............... 716/6 |
| 2003/0212940 | A1 | 11/2003 | Wong |
| 2004/0193979 | A1 | 9/2004 | Avery et al. |
| 2005/0125512 | A1 | 6/2005 | Fuller et al. |
| 2005/0257178 | A1 | 11/2005 | Daems et al. |
| 2006/0259871 | A1 | 11/2006 | Washington et al. |
| 2006/0282733 | A1 | 12/2006 | Whetsel |

OTHER PUBLICATIONS

U.S. Appl. No. 10/813,414; filed Mar. 29, 2004 by Stassart et al.
U.S. Appl. No. 11/895,132, filed Aug. 23, 2007, Trimberger.
U.S. Appl. No. 11/974,354, filed Oct. 11, 2007, Trimberger.
US. Appl. No. 11/974,387, filed Oct. 11, 2007, Trimberger.
U.S. Appl. No. 12/141,958, filed Jun. 19, 2008, Trimberger.
U.S. Appl. No. 12/141,959, filed Jun. 19, 2008, Trimberger.
U.S. Appl. No. 12/181,344, filed Jul. 29, 2008, Trimberger.
U.S. Appl. No. 12/181,346, filed Jul. 29, 2008, Trimberger.
Altera; Altera Data Sheet, vol. 1, Chapter 3 "Configuration and Testing"; and vol. 2 Chapter 8 "Remote System Upgrades with Stratix II Devices"; Feb. 2004; downloaded on Jun. 17, 2004 from http://www.altera.com/literature/lit-stx2.
Culbertson, W. Bruce et al.; "Defect Tolerance on the Teramac Custom Computer"; The 5th Annual IEEE Symposium on Field-Programmable Custom Computing Machines; Apr. 16-18, 1997; pp. 116-123.
Emmert, John et al.; "Dynamic Fault Tolerance in FPGAs via Partial Reconfiguration"; Annual IEEE Symposium on Field-Programmable Custom Computing Machines; Apr. 17, 2000; pp. 165-174.
Emmert, John M. et al.; "Incremental Routing in FPGAs"; ASIC Conference 1998. Proceedings, Eleventh Annual IEEE International; Rochester, NY; Sep. 13-16, 1998; pp. 217-221.
Hanchek, Fran et al.; "Node-Covering Based Defect and Fault Tolerance Methods for Increased Yield in FPGAs"; The Proceedings of the Ninth International Conference on VLSI Design; Jan. 1996; pp. 1-4.
Xilinx, Inc.; DS031 v1.1, "Virtex-II Pro Platform FPGA Handbook"; published Dec. 6, 2000; available from Xilinx, Inc., 2100 Logic Drive, San Jose, California 95124; pp. 33-75.

* cited by examiner

METHODS OF USING ONE OF A PLURALITY OF CONFIGURATION BITSTREAMS FOR AN INTEGRATED CIRCUIT

FIELD OF THE INVENTION

The present invention relates generally to integrated circuits, and in particular, to methods of using one of a plurality of configuration bitstreams for a programmable logic device.

BACKGROUND

Integrated circuits are an integral part of any electronic device. A variety of integrated circuits are often used together to enable the operation of the electronic device. While integrated circuits are typically designed for a particular application, one type of integrated circuit which enables flexibility is a programmable logic device (PLD). A programmable logic device is designed to be user-programmable so that users may implement logic designs of their choices. One type of programmable logic device is the Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

However, programmable logic devices are typically relatively complex and have physically large dice. In implementing semiconductor devices, it is important that the devices are free of defects and reliable throughout their use. When a semiconductor device fails after being installed in a device such as a consumer electronics device, such a failure may cause the entire consumer electronics device to fail. The large die size means that fewer dice are produced per wafer. Further, the chances that a physical defect, such as a dust particle on any portion of a die, may cause an electrical fault is increased. The minimum critical dimensions and number of layers of programmable logic devices also increase the possibility for electrical faults. Accordingly, programmable logic devices are tested after fabrication, and are binned according to performance, such as operating speed, as well as for pass/fail. The percentage of usable dice is called "silicon yield" because it indicates the fraction of usable integrated circuits in a manufactured lot. Since the device is larger and the logic is denser, there is a greater probability that the device will have a fatal defect. Because the number of usable dice significantly impacts profitability, it is important to enable the use of as many of the die of the wafer as possible.

One way to enable the use of defective programmable logic devices is to avoid the use of defective logic. However, customers are generally not able to specify their board timing well enough to enable PLD design tools to ensure that the programmable logic device will meet the timing requirements of the board. Therefore, the board must be qualified. Because the timing of paths in different implementations will be different, a quality-conscious customer may need to verify proper functionality of every possible bitstream in the system. If there are sixteen different possible bitstreams, the customer must qualify sixteen different systems. This qualification process may be expensive. Further, if the customer has two programmable logic devices in the system, he may need to qualify all combinations of the two programmable logic devices implementing the 16 designs, or 256 different systems. Testing that many systems would be too expensive and time consuming for nearly all customers.

While users of programmable logic devices have design constraints, and configuration tools typically meet all design constraints, there are some nets or paths that the customer does not constrain. This is typically because these nets or paths may not be enough of a concern for a customer to go to the effort of constraining them. In an implementation using conventional design tools, these unconstrained nets or paths are assigned whatever timing the tools provide, which can be very long. If timing is not an issue, then there is no problem with the unconstrained nets or paths. However, there may be timing issues with some of the unconstrained nets or paths. There is a further problem in that conventional tools may take a timing-constrained path and have it barely meet the timing in one design, but have a very large slack in another. That is, the constrained paths may have large variation, making it difficult to validate (qualify) a programmable logic device having a given design on a system.

Accordingly, there is a need for an improved method of implementing a programmable logic device adapted to receive one of a plurality of configuration bitstreams for a circuit design. There is a further need for an improved method for generating multiple implementations to avoid defects. One or more of these methods may simplify the validation process for the configuration bitstreams in the programmable logic device.

SUMMARY

Methods of implementing a programmable logic device using one of a plurality of configuration bitstreams for a design implemented in the programmable logic device are disclosed. An exemplary method comprises analyzing a plurality of implementations of the design to determine initial variations in timing among the implementations; modifying the implementations to reduce the variations in timing among the implementations (e.g., by adding delay to selected nets and/or paths); and outputting a plurality of configuration bitstreams for the implementations having variations in timing that are reduced relative to the initial variations in timing. Modifying the implementations to reduce the variations in timing between implementations may comprise iteratively modifying the implementations to satisfy maximum timing constraints for the design. Maximum timing constraints may comprise maximum constraints on nets of the design or maximum constraints on paths of the design. Modifying the implementations to limit the variations in timing between implementations may further comprise iteratively modifying the implementations to satisfy minimum timing constraints for the design.

According to an alternate embodiment, a method of implementing a programmable logic device using one of a plurality of configuration bitstreams for a design implemented in the programmable logic device comprises analyzing a plurality of implementations of the design; determining maximum timing constraints for the design; ensuring that each implementations of the design meets the maximum timing constraints; and validating the programmable logic device in a system using any configuration bitstream of the plurality of configuration bitstreams for the design. Determining maximum timing constraints for the design may comprise determining constraints on the nets of the design and/or constraints on paths of the design.

According to a further alternate embodiment, a method of implementing a programmable logic device using one of a plurality of configuration bitstreams for a design implemented in the programmable logic device comprises analyzing a plurality of implementations for the design; determining minimum timing constraints for the design; determining maximum timing constraints for the design; ensuring that each implementation meets the minimum timing constraints and the maximum timing constraints; and validating the programmable logic device using any of the plurality of configuration bitstreams for the design. The method may further comprise iteratively modifying, for each configuration bitstream of the plurality of configuration bitstreams, the design toward the minimum timing constraints.

According to another embodiment, methods of generating a plurality of configuration bitstreams for a design implemented in a programmable logic device are disclosed. An exemplary method comprises generating a plurality of implementations for the design; generating a cost function for the design based upon costs (e.g., collision penalties) derived from at least two of the plurality of implementations; determining a cost for each implementation based upon the cost function; optimizing an implementation of the design by minimizing the cost of the implementation; generating a plurality of configuration bitstreams for the plurality of implementations; and outputting the plurality of configuration bitstreams. Generating the cost function may comprise generating a cost function having a collision penalty based upon collisions for resources used by each implementation of the plurality of implementations.

According to an alternate embodiment, a method of generating a plurality of configuration bitstreams for a design implemented in a programmable logic device comprises generating a plurality of implementations for the design; generating a cost function having a collision penalty; determining a cost for each implementation based upon the cost function; iterating the plurality of implementations to optimize the cost of the plurality of implementations; generating a plurality of configuration bitstreams for the plurality of implementations; and outputting the plurality of configuration bitstreams. The method may further comprise designating resources of the programmable logic device that may be associated with a collision in the cost function, and determining a penalty for each designated resource associated with a collision in the cost function.

According to a further alternate embodiment, a method of generating a plurality of configuration bitstreams for a design implemented in a programmable logic device comprises analyzing a plurality of implementations of the design; determining maximum timing constraints for the plurality of implementations of the design; generating a cost function having a collision penalty; ensuring that each implementation meets the maximum timing constraints using the cost function; generating a plurality of configuration bitstreams for the plurality of implementations; and outputting the plurality of configuration bitstreams. The method may further comprise validating the programmable logic device in a system using any configuration bitstream of the plurality of configuration bitstreams.

DETAILED DESCRIPTION OF THE DRAWINGS

Figure 1:
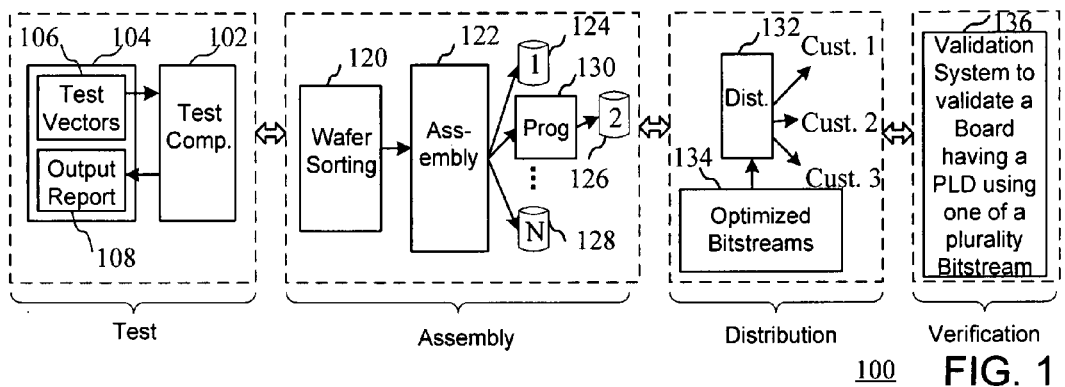
FIG. 1 is a block diagram of a system for validating a programmable logic device in a system according to an embodiment of the present invention.

Turning first to FIG. 1, a block diagram of a system for validating a programmable logic device in a system according to an embodiment of the present invention is shown. In particular, in enabling verification of a system such as a circuit board having a programmable logic device, a test computer 102 is coupled to a test program 104 comprising test vectors 106 and coupled to receive an output report 108 from the test computer 102. The test computer 102 may be any type of computer or system for testing dice of wafers to determine defects in the dice, as is well known in the art. For example, the test computer 102 may comprise a wafer tester from Credence Systems Corporation of Milpitas, Calif. or Teradyne Inc. of North Reading, Mass. An example of a wafer having a plurality of dice, including defective dice, will be described in more detail in reference to FIG. 2. The wafers are tested in a process known as "wafer sort" before the dice are separated from the wafer. Unlike conventional wafer testing where defective dice are discarded after the dice are separated from the wafer, certain dice having defects may still be used if the defects are avoided. Tested wafers are then provided to an assembly area, where a wafer sorting device 120 enables processing a batch of wafers for assembly of dice into integrated circuit packages by an assembly tool 122. While the wafer sorting device 120 and the test computer 102 are shown as separate elements, the test computer 102 may be a part of the wafer sorting device.

The assembled devices may be binned into various bins 124-128 according to given criteria, such as speed, for example. However, according to one aspect of the present invention, integrated circuits having defective programmable logic are binned in a separate bin, and more particularly, is a common bin 126. That is, integrated circuits having defective programmable logic may be binned in a common bin regardless of the location of the defective programmable logic. Because the defective integrated circuits are commonly binned, the location of the defective programmable logic is recorded for each integrated circuit. For example, each defective integrated circuit may be separately programmed by a programmer 130 to indicate the location of the defective programmable logic. For example, the location of the defect of a given integrated circuit may be stored in a non-volatile memory of the integrated circuit. The programmer may be incorporated as a part of the assembly tool 122, or may be a separate programming computer or programming device, for example. Alternatively, a record in a computer database external from the defective programmable logic device could be created to indicate the location of a defect in a programmable logic device based upon an identifier associated with the device, such as a bar code, a serial number, an electronically-stored device serial number, or some other unique identifier for the device. That is, the device itself could be physically marked with some identifier indicating the location of a defective portion of programmable logic, or the location of the defect or defects may be re-generated when needed by a test procedure.

According to one embodiment to enable the use of defective programmable logic devices, multiple implementations of a single customer design are built. Each implementation of the customer's design performs the same function, but uses a different set of the programmable resources on the PLD and has a corresponding bitstream that may be used to program the PLD. Since each implementation has a single corresponding bitstream, the terms may be used interchangeably, where a bitstream may refer to an implementation even though the translation from the design database to the actual bits that program the PLD has not been made. Further, the implementation may be incomplete, for example, some nets or paths may not yet be routed. Each implementation may also have subtle timing differences. Additional details regarding identifying and storing the location of defects in an integrated circuit may be found in the U.S. patent application entitled "Methods of Enabling the Use of a Defective Programmable Logic Device", filed by the Applicant of the present application on the same date as the filing of the present application, the entire application of which is incorporated by reference.

Other methods of using multiple bitstreams to avoid defects include methods that do not require storage of the defect location, but instead test each device for proper functionality with a bitstream to select that bitstream. The disclosed structures and methods may be applied to verify systems that include programmable logic devices that employ this type of defect avoidance. For example, one bitstream of a plurality bitstreams is selected by trial and error, where a tested bitstream that functions correctly is selected. That is, the selected bitstream need not correspond to a programmable logic device having defects in a given region, but could be selected to be implemented in different devices after being tested and determined to function with those devices.

While the identification of the location of the defect of a defective integrated circuit is beneficial when a specific defective integrated circuit is actually implemented in a system, the plurality of devices having defects in different locations, and therefore requiring different configuration bitstreams, creates problems in validating a system having a programmable logic device, as set forth above. In order to enable validating a programmable logic device using any of the configuration bitstreams, the plurality of bitstreams are modified to minimize the variation between the bitstreams, as will be described in more detail below. The assembled integrated circuit packages are shipped during a distribution process, where a distribution channel 132 enables integrated circuits to be shipped to customers. During the distribution process, the integrated circuits may further be programmed with configuration bitstreams which avoid the defective portion of the programmable logic, or without the configuration bitstreams enabling them to instead be programmed by customers.

Figure 2:
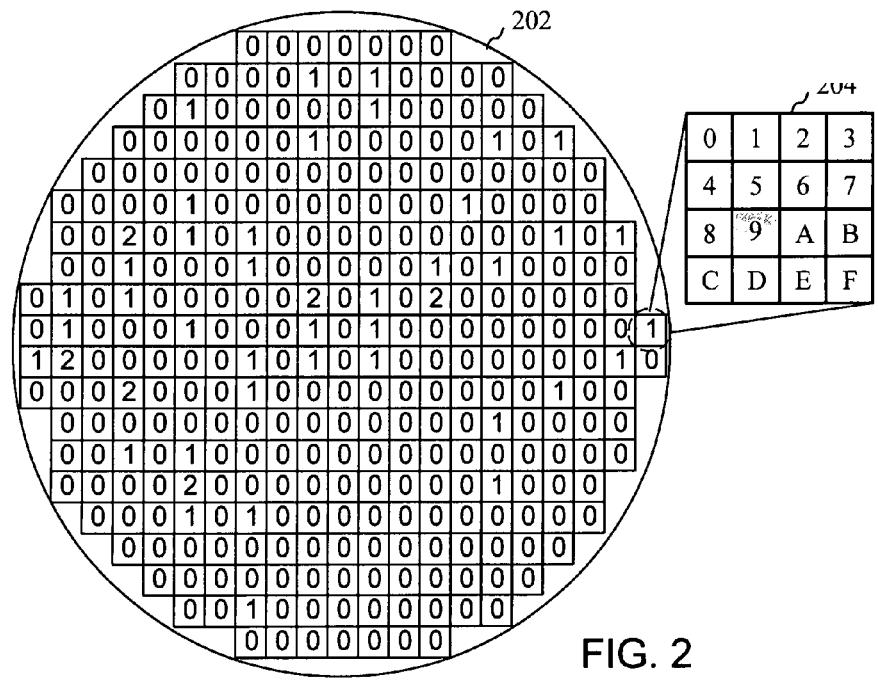
FIG. 2 is a top plan view of an integrated circuit wafer having a plurality of dice including defective dice.

Turning now to FIG. 2, a top plan view of an integrated circuit wafer having a plurality of dice including defective dice is shown. FIG. 2 shows a silicon wafer 202 having dice for programmable logic devices represented by the squares. The programmable logic devices are assigned a number showing the number of defective regions. A representative die 204 has a shaded region showing the location of the single defective region. The location of the defective region may be identified according to the physical location of the defects on the die, the functionality of the defective programmable logic, programmable logic identified by the application of predetermined test vectors, or any other designation of a region or collection of physical resources which would enable a user to avoid the defective programmable logic in the device. The regions need not be the same size or evenly distributed on the die, and identifying defective regions of a device may depend on the layout and functional design of the device. Regions need not be defined by physical locality, but may be convenient collections of physical resources that may all be avoided simultaneously by the placement and routing software. While die 204 is divided into sixteen regions, where the shaded region 9 is identified as the single defective region by way of example, the die may be defined by more or fewer regions, and/or have more than one defective region. Because defective dice may have defective programmable logic in different regions, a circuit design implemented in the different devices may operate differently, making validation of system having a circuit design implemented in programmable logic difficult.

Figure 3:
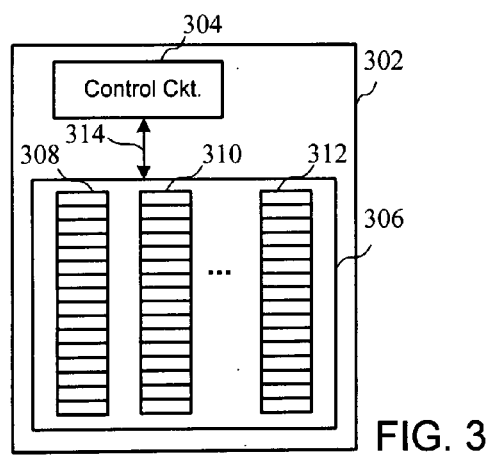
FIG. 3 is a block diagram of a system for generating a plurality of bitstreams for a programmable logic device according to an embodiment of the present invention.

According to one aspect of the invention, the variation between the implementations is minimized so that a customer may use any of the configuration bitstreams in validating a system having a programmable logic device. As shown in the block diagram of the system for generating a plurality of configuration bitstreams for a programmable logic device of FIG. 3, a computer 302 comprises a control circuit 304 coupled to a memory 306 which stores a plurality of configuration bitstreams 308-312. The plurality of configuration bitstreams enables the implementation of a given circuit design in a plurality of programmable logic devices having defective programmable logic in different regions. For example, the memory 306 may store sixteen bitstreams comprising one bitstream for each of sixteen different devices having defective programmable logic in one of the sixteen different regions. That is, each bitstream may be used to avoid programmable logic of a given region. As will be described in more detail below, timing constraints for the design may be based upon nets or paths, for example. A net represents a collection of interconnect lines from the output of a user logic block to inputs of the next destination block, while a path represents a sequence of nets between registers comprising a connection from a source to a specific destination. A path may be defined as a clock to clock path, such as one register to another register, a register to an output, an input to a register, or an input to an output, as is well known in the art. The bitstreams may be generated using configuration software, such as ISE Foundation software, available from Xilinx, Inc. of San Jose, Calif., or some other suitable configuration software.

Figure 4:
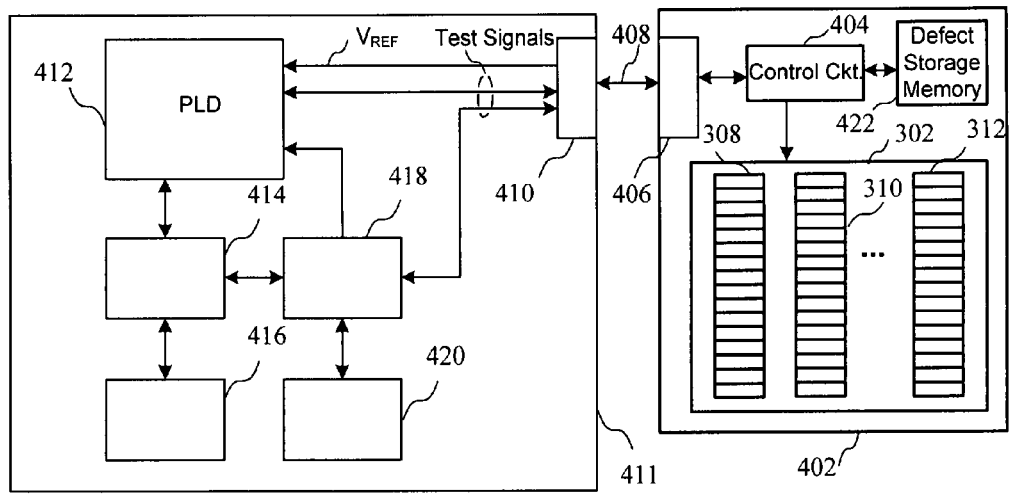
FIG. 4 is a block diagram of a device for validating a programmable logic device on a system according to an embodiment of the present invention.

Turning now to FIG. 4, a block diagram of a device for validating a programmable logic device on a system according to an embodiment of the present invention is shown. In particular, a computer 402 comprises a control circuit 404 coupled from an input/output port 406 by way of a communication link 408 to a input/output port 410 of a circuit board 411 having a programmable logic device 412. The programmable logic device is coupled to other integrated circuits or other devices 414-420, directly or indirectly. Some devices, such as device 418, may also be directly coupled to the input/output port 410. Device 418 may be a non-volatile memory for storing a configuration bitstream downloaded to the system. A reference voltage $V_{REF}$ is coupled to the programmable logic device 412, as well as other devices on the board. Similarly, test signals are provided to the programmable logic device 412 and other devices to qualify the programmable logic device on the board. The validation of the circuit board ensures that the programmable logic device and other devices on the board meet timing requirements to interact as required. While any of the configuration bitstreams may be used if the PLD 412 is not defective, a specific configuration bitstream may be selected if the PLD is defective. Accordingly, a defect-storage memory 422 may store identifiers for the bitstream associated with identifiers for the defective programmable logic device to select the correct configuration bitstream. That is, the correct configuration bitstream may be read from a non-volatile memory of the PLD 412, or may be determined from an identifier stored in the non-volatile memory of the PLD or otherwise associated with the PLD (e.g., stored in an off-chip memory). As will be described in more detail below in reference to FIG. 5, the reference voltage $V_{REF}$ may be adjusted for purposes of validating the board having the programmable logic device.

Figure 5:
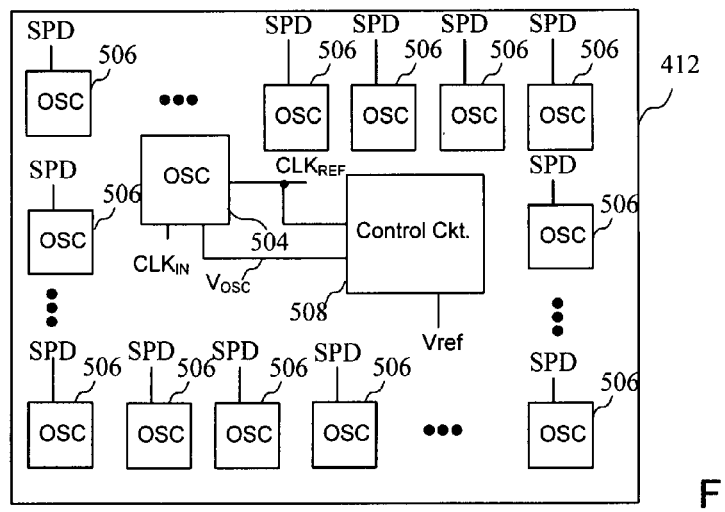
FIG. 5 is a block diagram of a programmable logic device according to an embodiment of the present invention.

Turning now to FIG. 5, a block diagram of a programmable logic device according to an embodiment of the present invention is shown. After minimizing the variation in timing between implementations, there is still a possibility that the actual programmable logic device used by the customer is unusually fast, thereby giving better results than promised and negating the effort to minimize the variation between implementations. Accordingly, an oscillator 504, which is coupled to receive a voltage $V_{OSC}$ and generate an internal reference clock $CLK_{REF}$, may be implemented in programmable logic on the die to measure performance. The $CLK_{REF}$ output of the oscillator 504 may be used by the customer to adjust the reference voltage $V_{REF}$ to slow the programmable logic device down, where a greater voltage reduction is required to slow the programmable logic device down more. Alternatively, a customer verifying a system such as a circuit board or other system having devices interacting with the programmable logic device may check timing by using that oscillator and the same design in several dice, and choose the slowest die. Rather than adjusting the reference voltage, fast oscillators 506 may be added around the die to intentionally heat up the die. The oscillators are controlled by a speed (SPD) signal, wherein heating up the die will slow down the SPD signal. By comparing the $CLK_{REF}$ of the oscillator 504 with an external reference frequency, it is possible to determine the frequency of the fast oscillators 506 using a feedback path to a control circuit 508. If the $CLK_{REF}$ of oscillator 504 is faster than the external frequency, the speed of the oscillators is increased to heat the die and slow it down.

Figure 6:
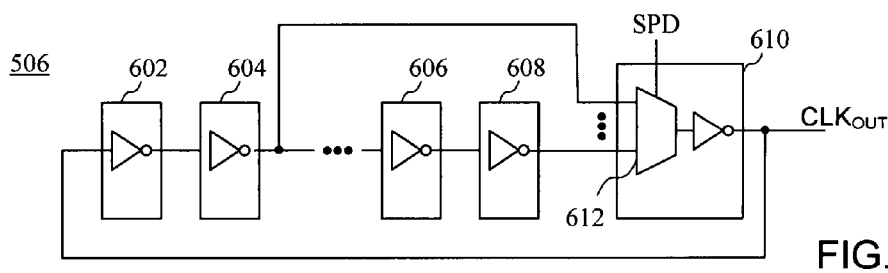
FIG. 6 is a block diagram of an oscillator of a programmable logic device enabling validation of the programmable logic device on a system according to an embodiment of the present invention.

Because the use of the fast oscillators 506 may require a large number of heaters, which may necessitate using a larger device, it may be possible to adjust a digital clock manager (DCM) to generate a different frequency, or build an adjustable oscillator frequency generator out of lookup tables (LUTs) or partially out of LUTs, where multiplexer settings may be used to bypass LUTs in the oscillator chain as shown in FIG. 6. The circuit of FIG. 6 may be used as a heater or to generate a clock for distributed heaters. When used as a heater, as many as possible of the LUTs should be inverters, where an odd number of inversions is needed. In the exemplary embodiment of FIG. 6, five inverters 602-610 are coupled in series, where the last inverter 610 comprises a multiplexer 612 which is coupled to receive the outputs of the inverters 604 and 608. The speed (SPD) control signal controls the speed of the oscillator, and therefore the heat generated. The speed control signal may be set by resetting the reference oscillator count, and waiting a preset number of clock cycles of the frequency of $CLK_{REF}$. If the reference oscillator count is greater than the preset number of cycles of the external reference clock, then the speed is increased, where the faster speed generates more heat, and therefore decreases the frequency of the internal reference clock $CLK_{REF}$. If the reference oscillator count is less than the preset number of cycles of the external reference clock, then the slower speed generates less heat, resulting in a faster internal reference oscillator.

Figure 7:
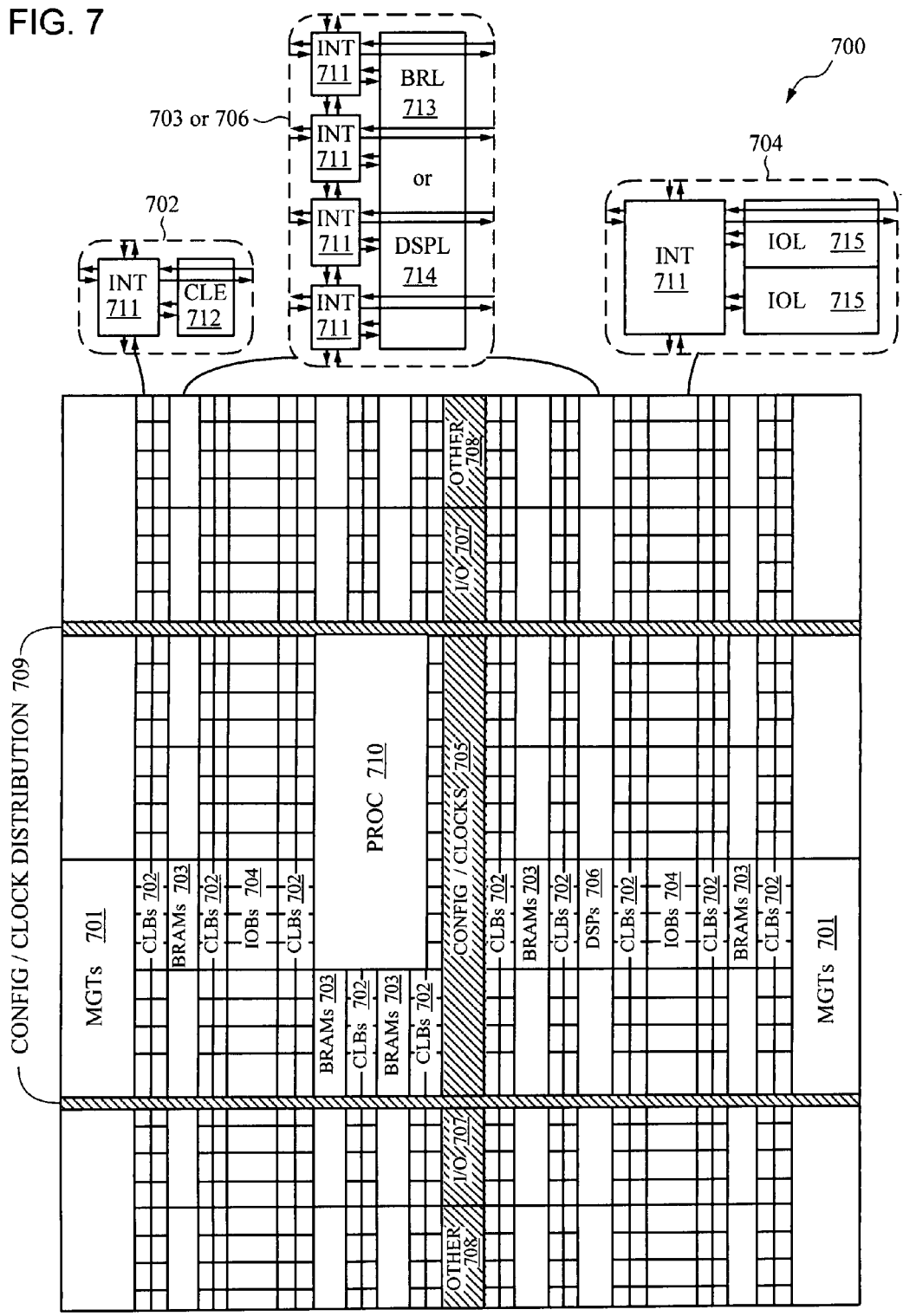
FIG. 7 is a more detailed block diagram of a programmable logic device according to an embodiment of the present invention.

Turning now to FIG. 7, as noted above, advanced FPGAs may include several different types of programmable logic blocks in the array. For example, FIG. 7 illustrates an FPGA architecture that includes a large number of different programmable tiles comprising programmable logic including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 may include a configurable logic element (CLE 712) that may be programmed to implement user logic plus a single programmable interconnect element (INT 711). A BRAM 703 may include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 706 may include a DSP logic element (DSPL 714) in addition to an appropriate number of programmable interconnect elements. An IOB 704 may include, for example, two instances of an input/output logic element (IOL 715) in addition to one instance of the programmable interconnect element (INT 711). As will be clear to those of skill in the art, the actual I/O pads connected, for example, to the I/O logic element 715 typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 8:
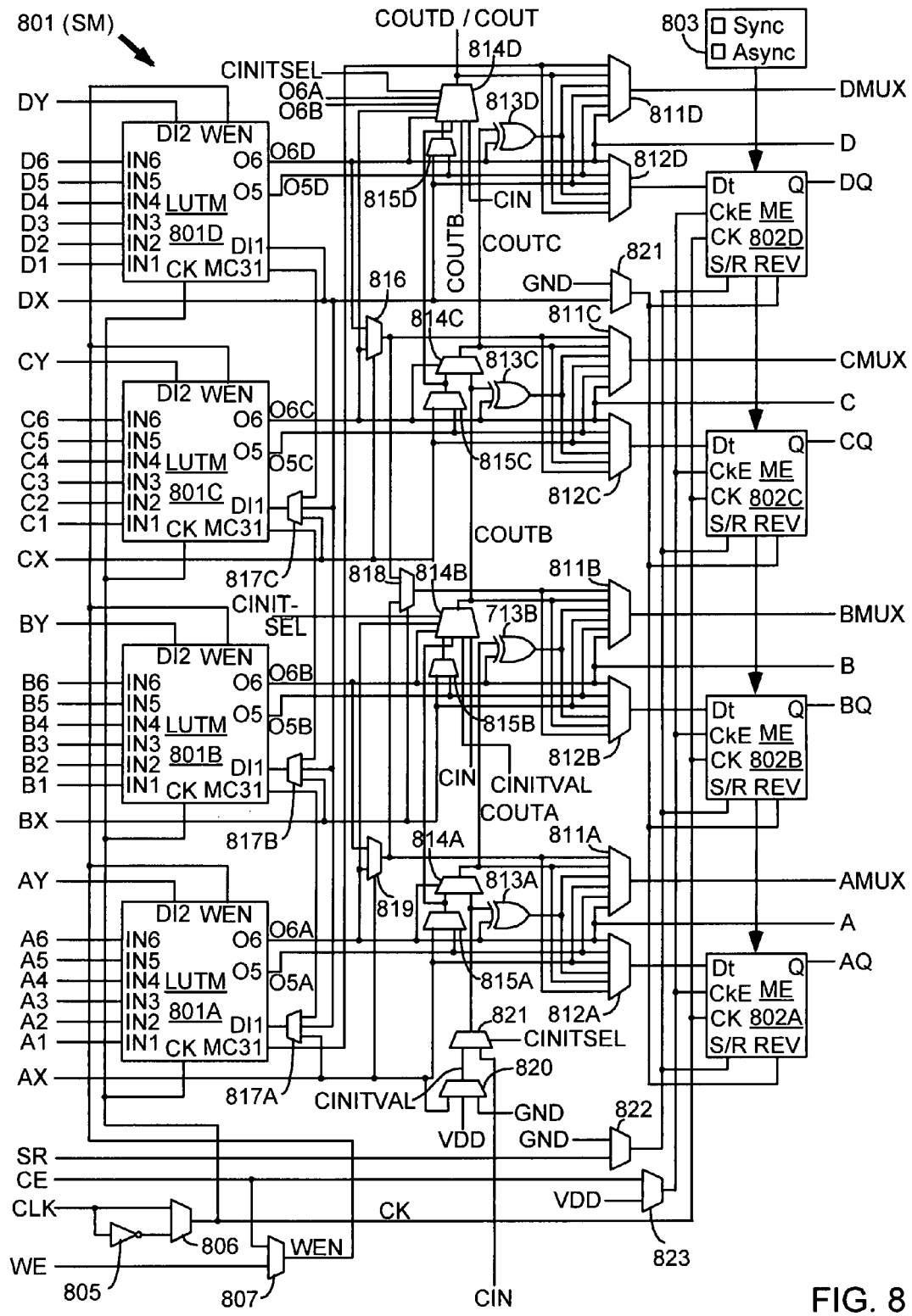
FIG. 8 is a block diagram of a configurable logic element of the programmable logic device of FIG. 7 according to an embodiment of the present invention.

Turning now to FIG. 8, a block diagram of a configurable logic element of the programmable logic device of FIG. 7 according to an embodiment of the present invention is shown. In particular, FIG. 8 illustrates in simplified form a configurable logic element of a configuration logic block 702 of FIG. 7. In the embodiment of FIG. 8, slice M includes four lookup tables (LUTMs) 801A-801D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 811, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-823; a circuit represented by inverter 805 and multiplexer 806 (which together provide an optional inversion on the input clock path); and carry logic comprising multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 8 for clarity, as well as from other selected figures herein.

In the pictured embodiment, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the embodiment of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 806 and by write enable signal WEN from multiplexer 807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 701A may also be provided to the general interconnect structure for shift register chaining, via output select multiplexer 811D and CLE output terminal DMUX. The devices having programmable logic and methods of the present invention may be implemented according to the device of FIGS. 7 and 8, or in any device, including any type of integrated circuit having programmable logic.

Figure 9:
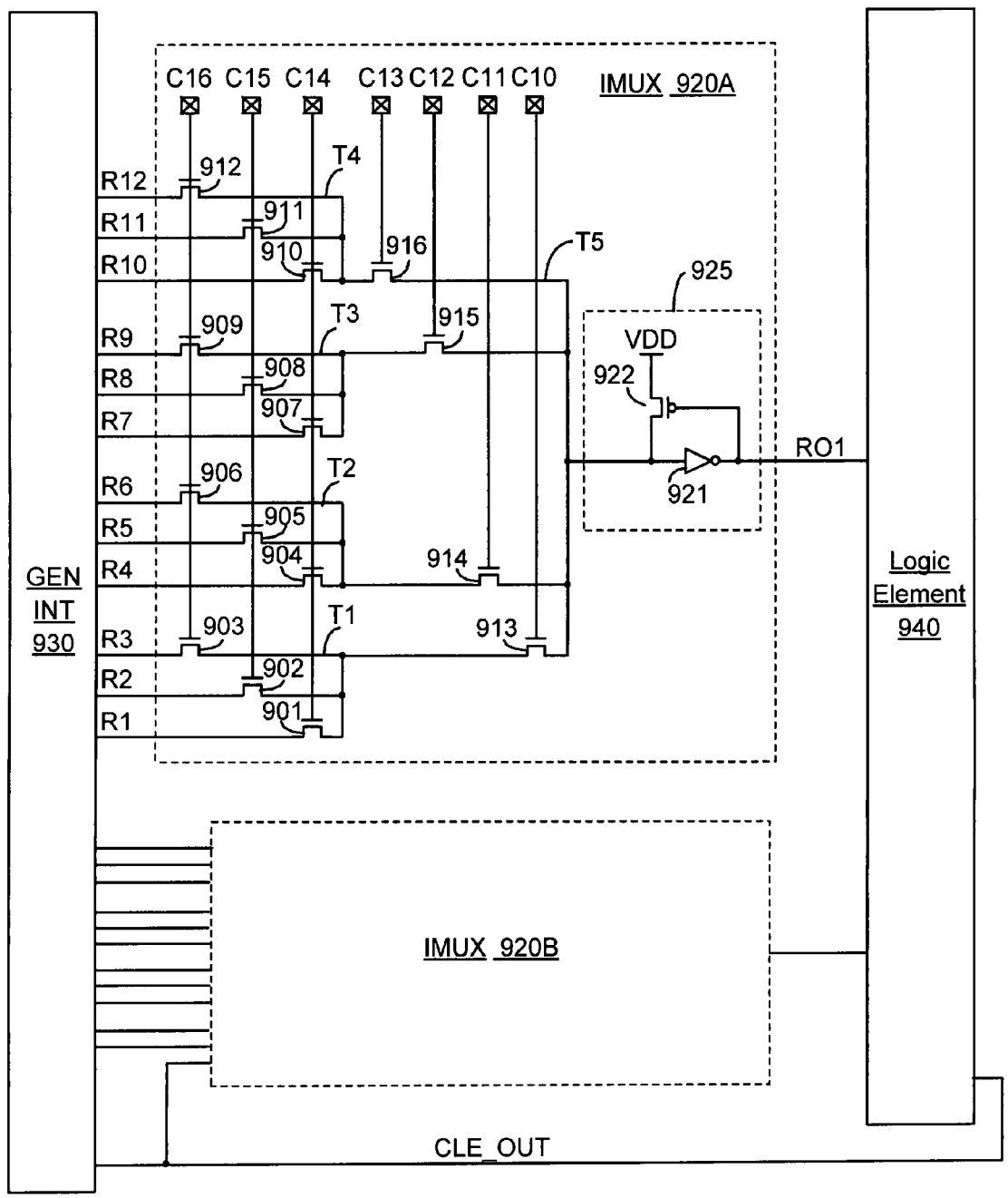
FIG. 9 is a block diagram of interconnect logic of the programmable logic device of FIG. 7 according to an embodiment of the present invention.

Turning now to FIG. 9, a block diagram of exemplary interconnect logic of the programmable logic device of FIG. 7 according to an embodiment of the present invention is shown. In particular, FIG. 9 illustrates how a programmable input multiplexer 920 may be used to provide additional routing flexibility between the general interconnect structure 930 and a configurable logic element 940, where longer or shorter paths may be created in the general interconnect structure to meet timing requirements. An input multiplexer provides the ability to select one of many different interconnect lines to provide a signal to a CLE input terminal. An input multiplexer may be implemented, for example, as shown in FIG. 9. The illustrated circuit selects one of several different input signals and passes the selected signal to an output terminal. Note that FIG. 9 illustrates an input multiplexer with twelve inputs, but programmable logic device input multiplexers typically have many more inputs, e.g., 20, 24, 28, 30, 36, or some other number. However, FIG. 9 illustrates a smaller circuit, for clarity.

Each input multiplexer 920A, 920B of FIG. 9 includes twelve input terminals R1-R12 and sixteen pass gates 901-916. Pass gates 901-903 selectively pass one of input signals R1-R3, respectively, to a first internal node T1. Each pass gate 901-903 has a gate terminal driven by a configuration memory cell C14-C16, respectively. Similarly, pass gates 904-906 selectively pass one of input signals R4-R6, respectively, to a second internal node T2. Each pass gate 904-906 has a gate terminal driven by one of the same configuration memory cells C14-C16, respectively. From internal nodes T1, T2, pass gates 913, 914 are controlled by configuration memory cells C10, C11, respectively, to selectively pass at most one signal to another internal node T5. Pass gates 907-912 and 915-916 are similarly controlled by configuration memory cells C12-C16 to select one of input signals R7-R12 and to pass the selected input signal via one of internal nodes T3, T4 to internal node T5, as shown in FIG. 9. The signal on internal node T5 is pulled up by structure 925 to provide a full-swing output signal RO1. Buffer 925 includes an inverter 921 and a pull-up (e.g., a P-channel transistor 922 to power high VDD) on internal node T5 and driven by the output of inverter 921. Thus, values stored in configuration memory cells C10-C16 select at most one of the input signals R1-R12 to be passed to internal node T5, and hence to output node RO1. If none of the input signals is selected, output signal RO1 may be held at a low value by pull-up 922. The interconnect logic of FIG. 9 and other interconnect elements of the general interconnect structure 930 may be used to adjust the delay time of the nets to meet the minimum timing requirement.

Figure 10:
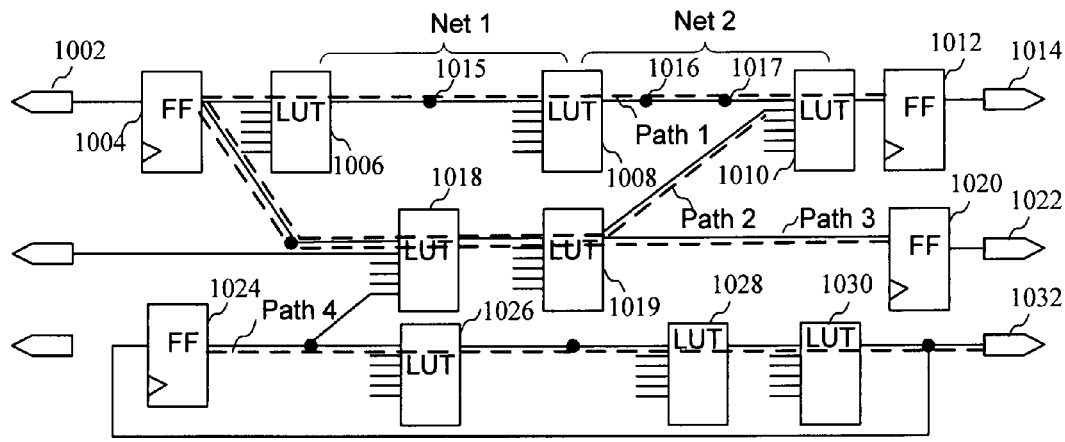
FIG. 10 is a block diagram of an example of nets and paths in a programmable logic device according to an embodiment of the present invention.

Turning now to FIG. 10, a block diagram shows an example of nets and paths in a programmable logic device according to an embodiment of the present invention. In particular, an input/output (I/O) port 1002, which may comprise a primary input, is coupled to an input of a register 1004, shown here as a flip-flop (FF), the output of which is coupled to an input of a LUT 1006. Some inputs of LUTs and FFs in FIG. 10 are shown without nets attached. These nets may connect to other nets, LUTs or FFs, but are not shown for clarity. The output of the LUT 1006 is coupled to a second LUT 1008, the output of which is coupled to a third LUT 1010. The output of the LUT 1010 is coupled to a register 1012 which is coupled to an I/O port 1014. The I/O port 1014 may comprise a primary output. By way of example, a first path extends from the register 1004 to a register 1012 by way of LUT 1006, LUT 1008 and LUT1010. Also shown by way of example, a first net (Net1) is defined between LUT 1006 and LUT 1008, and comprises one interconnect point 1015 connecting two interconnect wire segments. The interconnect point may comprise a programmable interconnect point (PIP). For example, the interconnect point could comprise a programmable multiplexing network similar to the multiplexing network 920A of FIG. 9, or some other suitable multiplexing network. In contrast, a second net (Net2) extending from the LUT 1008 to the LUT 1010 comprises two interconnect points 1016 and 1017 connecting interconnect wire segments. As described above, the connection from the output of one LUT to the input of another LUT may be established by a number of different nets which may comprise different delays and may be selected to comprise a desired delay or meet a minimum delay. A second path, path 2, between the register 1004 and register 1012 is shown extending through LUTs 1018 and 1019, and back to LUT 1010. A third path, path 3, extends from register 1004, through LUTs 1018 and 1019 to a register 1020, the output of which is coupled to an I/O port 1022. The output of a register 1024 is coupled by way of LUTs 1026-1030 to an I/O port 1032, as shown by path 4. A feedback loop is also shown, which would be considered a separate path. The interconnect multiplexers of FIG. 9 may be used to provide input flexibility between a general interconnect structure and configurable logic elements in FIG. 10 and enable adjusting nets to meet minimum and/or maximum timing constraints. The embodiment of FIG. 10 is merely shown by way of example, to show nets and paths in programmable logic of a programmable logic device. However, it should be understood that nets may include many additional interconnect segments and interconnect points, while paths may include many additional LUTs and registers.

Figure 11:
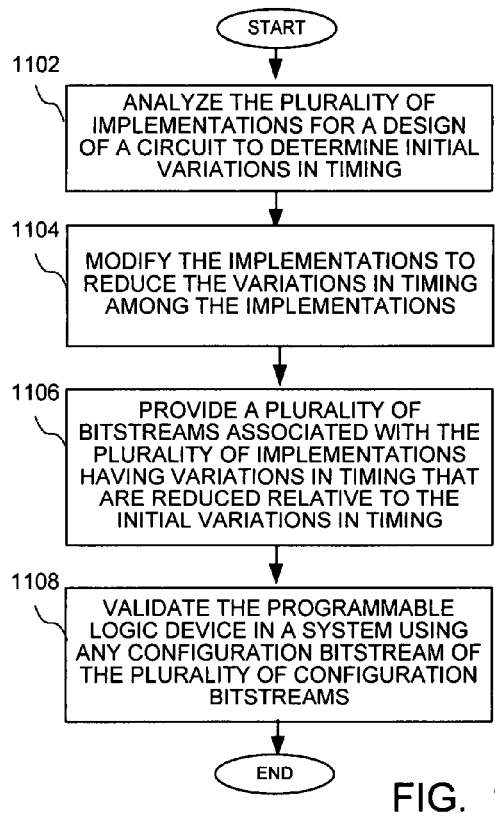
FIG. 11 is a flow chart showing a method of validating a programmable logic device on a system by modifying implementations of a design according to an embodiment of the present invention.

Turning now to FIG. 11, a flow chart shows a method of validating a programmable logic device on a system by modifying implementations of a design according to an embodiment of the present invention. In particular, a plurality of implementations is analyzed at a step 1102, to determine initial variations in timing among the implementations. The implementations are modified (e.g., iteratively modified) to reduce the variations in timing among the implementations at a step 1104. For example, additional delay can be added to nets and/or paths in implementations where these nets and/or paths are faster than in other implementations. A plurality of bitstreams associated with implementations having variations in timing that are reduced relative to the initial variations in timing are provided at a step 1106. While reducing the maximum allowed delay in timing for the implementations will lead to improvements when implementing the device, reducing the variations in timing (e.g., constraining both minimum and maximum delays) enables validating a system using any of the implementations. That is, aside from any other benefit of reducing the variations in timing among the implementations, a programmable logic device using any one of the configuration bitstreams associated with the implementations may be validated in a system. Accordingly, the programmable logic device may be validated in a system using any configuration bitstream of the plurality of configuration bitstreams at a step 1108.

While designs having different timing can create a problem in validating a PLD in a system, the variation in timing becomes significant when the timing of nets or paths in the different designs vary too much. If the timing of the designs does not vary significantly, then verifying the system with one bitstream will give results that are applicable to all bitstreams. While all bitstreams could have the exact same timing on all nets in an extreme case, it is unlikely, even in a case of the same bitstream implemented in different programmable logic devices. Therefore, for each net, every design is analyzed in an attempt to reduce time variation, where the variation may be absolute, such as time in nanoseconds (ns), or as a percentage of the net or path delay. The implementations can then be modified (e.g., iteratively modified) to reduce the variations in nets or paths. One possible solution is to constrain all nets or paths to a maximum timing constraint. These extra timing constraints may be generated to be loose constraints to make it an easy task for the configuration software. Because the solution provides an upper bound on all nets, a user is assured that no net in the design will exceed that value.

Figure 12:
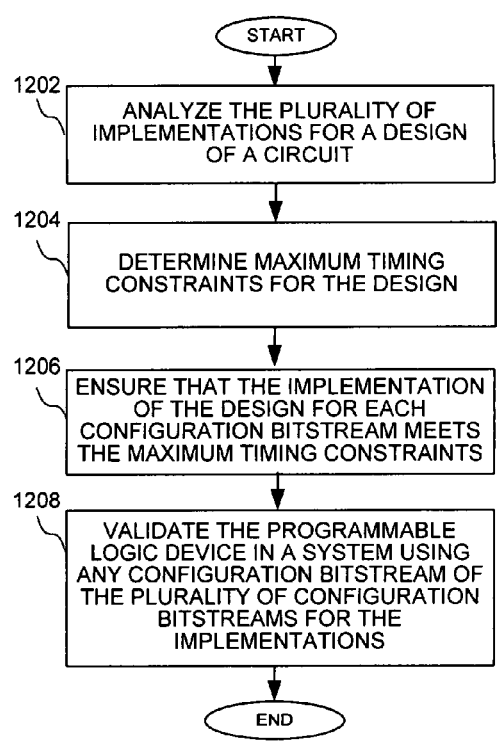
FIG. 12 is a flow chart showing a method of validating a programmable logic device on a system based upon maximum timing constraints according to an alternate embodiment of the present invention.

As shown in the flow chart of FIG. 12, a method enables validating a programmable logic device on a system based upon maximum timing constraints. In particular, a plurality of implementations is analyzed at a step 1202. Maximum timing constraints are determined for the design at a step 1204. For example, a signal may need to arrive in at most 10 nanoseconds (nsec) to be stored in a register. In this case, the maximum timing constraint would be 10 nsec. In contrast, a signal may require at most 5 nsec to be stored in a register, and a maximum timing constraint would be 5 nsec. By applying identical maximum timing constraints to corresponding nets in each design, it is ensured that the implementation of the design for each configuration bitstream meets the maximum timing constraints at a step 1206. The programmable logic device is validated in a system using any configuration bitstream of the plurality of configuration bitstreams at a step 1208. That is, because each implementation meets the maximum timing constraints, the system may be validated using a programmable logic device employing any of the configuration bitstreams. As will be described in more detail below, a minimum timing constraint, comprising a minimum amount of delay allowed for a signal to arrive to be stored in a register, may also be used to reduce the variation between the plurality of implementations.

While providing an upper bound on the nets solves some problems with validating a PLD in a system, there are additional improvements that may be made to give even greater assurance when validating the PLD in the system. A system may be dependent on the performance of a variation in nets which happens to be a large variation. For example, a net may arrive at an I/O pin too early, causing a board level race condition or write-through. Because the board-level timing might be unspecified during the design of the programmable logic device, it may be difficult to detect that a problem exists. These problems may only be found at board-verification time. If only a single programmable logic device bitstream were used in the system, that problem would quickly be found at board-verification time. In a defect-avoidance case, it would be necessary to verify the faster design to find the problem. Therefore, the design tools need not merely enforce a maximum delay or a minimum delay, but rather may strive to minimize the variation of net delays from design to design. The variation in a net delay is the difference between the maximum delay value of the net for all implementations in the set of implementations and the minimum delay of the net for all the implementations in the set of implementations. Accordingly, instead of applying only an upper bound on the delay, a lower bound may also be applied to keep nets from being too fast, where the upper and lower bounds are set to minimize the variation between the implementations. Thus, all net delays will fall between the two values, limiting the variation in the implementations.

Figure 13:
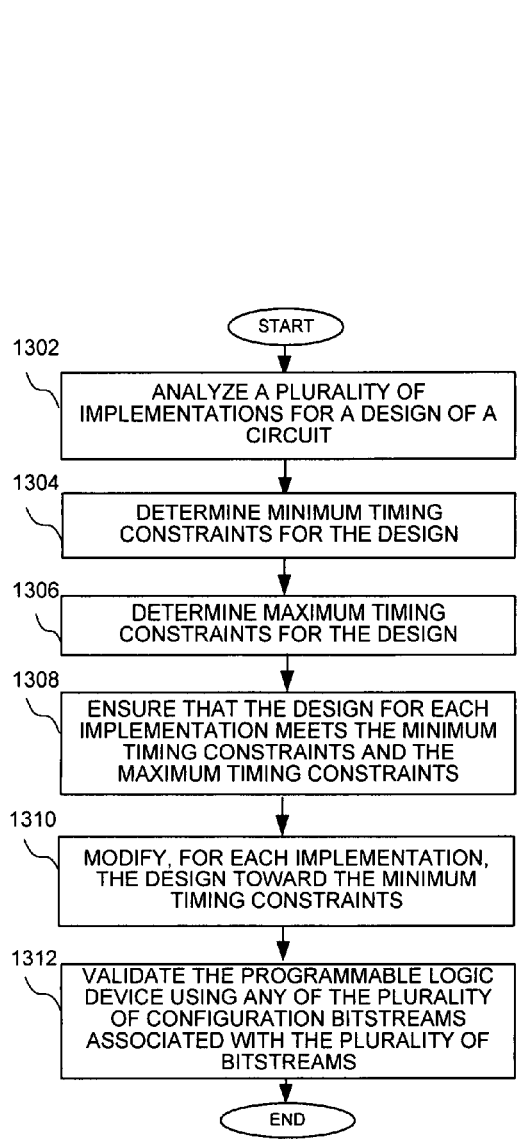
FIG. 13 is a flow chart showing a method of validating a programmable logic device on a system based upon minimum and maximum timing constraints according to a further alternate embodiment of the present invention.

Accordingly, the method of FIG. 13 shows validating a programmable logic device on a circuit board based upon minimum and maximum timing constraints. In particular, a plurality of implementations is analyzed at a step 1302. Minimum timing constraints are determined for the design at a step 1304. Maximum timing constraints are determined for the design at a step 1306. (Note that steps 1304 and 1306 may occur in either order, or simultaneously.) It is then ensured that the design for each implementation meets the minimum timing constraints and the maximum timing constraints at a step 1308. That is, the designs are rerouted and new bitstreams are generated to ensure that both the minimum and maximum timing constraints are met. For each implementation, the design is preferably modified (e.g., iteratively modified) toward the minimum timing constraints at a step 1310. Implementations are repeatedly re-generated using tighter constraints, preferentially increasing the minimum allowed delay. Finally, the programmable logic device is then validated using any of the plurality of configuration bitstreams for the implementations at a step 1312.

Figure 14:
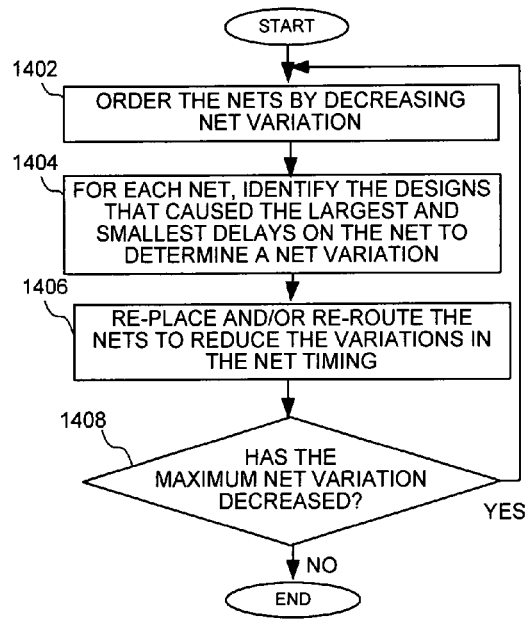
FIG. 14 is a flow chart showing a method of rerouting nets of a programmable logic device according to a further alternate embodiment of the present invention.

For each net or path, the distribution of delays among all designs may be generated. For example, for a design having 16 implementations, there will be up to 16 different delays for each net or path. As shown in the flow chart of FIG. 14, the nets are ordered by decreasing net variation at a step 1402. This will enable reducing the biggest variations first. For each net, the designs that caused the largest and smallest delays on the net are identified at a step 1404 to determine net variation. The nets are then re-placed and/or re-routed to reduce the variations in the net timing at step 1406. It is then determined whether the maximum net variation was improved (decreased) at a step 1408. If not, the optimization process is complete. If there was improvement, further improvement is sought by repeating the optimization process.

Some options for modifying variations in delays include guaranteeing timing as well as the variation in timing through using a slack adder in signals that are critical in at least one design. Lengthening small delays is generally easier, because this may be accomplished by choosing longer paths for the nets. In some embodiments, non-critical paths may be forced to a timing constraint that is a percentage lower than the minimum timing constraints for critical paths. For example, delay may be added to the non-critical paths to force them to be above the minimum timing constraints. Alternatively or additionally, delay may be added to all non-critical paths to force them to a constant level that is a large percentage less than the minimum timing constraints. Because minimum delays on some nets and paths are less significant, such as those in a clocked state machine, there is no problem if those nets are too fast. For example, most nets that drive benign synchronous structures may have delays that are less than the minimum timing constraints.

The conventional software flow for an FPGA design comprises synthesis, packing, placement and routing, as is well known in the art. Since defects in the device are in physical locations, the defects are most commonly avoided by changing placement and routing. Therefore, the task of generating designs with similar timing is preferably accomplished by adjusting placement and routing. A common placement algorithm uses the simulated annealing algorithm, which implements a single trial of the design and tries different placements of the gates and routing in the design, and rates them using a cost function. An example of a cost function may be defined as:

$$Cost = A*resources\_used + B*delay\_penalty,$$

where A and B are constants that give different weight to the two parts of the cost. Delay may be given more attention by increasing the value of B relative to A.

Resources_used may include the total number of logic blocks, or the total estimated wire length in the design. Delay- _penalty may include the sum of the differences between the actual delay and the desired delay for each net of the design. Typically, the delay penalty of a net (i) will be defined as:

Delay_penalty[i]=if actual_delay[i]<desired_delay[i]
then 0 else(actual_delay[i]−desired delay[i]).

If a net is faster than desired, then the delay_penalty will be zero. Accordingly, the well-known simulated annealing algorithm adjusts placement of logic to reduce the cost of the whole design.

According to an alternate embodiment, the cost function may be adjusted to penalize nets that are too fast. In this cost function, delay_penalty having a minimum delay (min_delay) may be defined as:

Delay_penalty[i]=if actual_delay[i]<desired_min_delay[i] then C*(desired_min_delay[i]−actual_delay[i])else if actual_delay[i]<desired_delay[i]
then 0 else(actual delay[i]−desired delay[i]).

That is, desired_min_delay now adds a penalty with a weight C to nets that are faster than the fastest desired delay. With this cost function, the desired_min_delay of all nets may be set, and all designs re-placed to minimize the amount by which the nets are faster than the desired min delay. If desired_min_delay is set to the same value as desired_delay, simulated annealing will attempt to get all delays exactly equal to their desired delay.

According to one embodiment, multiple configurations may be generated for the same function in order to make a set of implementations in which at least one of the set avoids each possible defect in the FPGA. The designs may then be iteratively modified, placing one design at a time with ever-tightening min_delay constraints. Already-placed designs are re-placed to tighten the constraint. This same method may be applied to routing as well, if desired. A router has a cost function having a desired delay, and a cost for being slower than the maximum delay or for being faster than the minimum delay. The same iterative modifications for tightening min_delay constraints are applied during routing to get similar net delays. Rather than iteratively modifying placement and then routing, it may be more effective in some situations to complete both placement and routing for each design before iteratively modifying all of them to tighten the min_delay constraint.

According to another aspect of the invention, rather than building multiple implementations independently, all implementations may be generated simultaneously, where the same design is placed and routed in multiple instantiations. Each instantiation may have a cost function that includes a penalty for collisions and a penalty for variation in net delays across designs. A collision occurs when all implementations in the set use the same resource of the programmable logic device. A resource of the programmable logic device may comprise any circuit element or group of elements. For example, a resource may be as fundamental as an interconnect line of a PIP, or may be a group of elements such as a lookup table. Alternatively, a resource may be a larger block of elements of the programmable logic device, such as a CLB, BRAM, or other block set forth above in FIG. 7, or a group of blocks, such as CLBs in a given column. An optimization algorithm may be employed to carry forward multiple high-quality designs, such as simulated evolution. For example, all of the set of designs may be built simultaneously, performing, for example, sixteen simulated annealings simultaneously (or performing one step for each design in sequence). By tightening the min_delay constraint, all sixteen designs will converge to similar delay values.

A cost function including a collision penalty may be defined as:

Cost=A*resources_used+B*delay_penalty+
D*collision_penalty, where D is another constant to weight the penalty for having a physical resource that is used in all of the implementations. The collision-penalty for a given implementation, which may be defined as the sum of all collisions with other implementations, may be determined based upon different values for different resources involved in a collision. For example, a penalty for a collision involving an interconnect line or a PIP may have a first value which is less than a value for a penalty involving a collision involving a lookup-table. Therefore, the collision_penalty for a number of collisions involving PIPs may be less than for one collision involving a CLB or a single lookup table. By penalizing collisions, the placer or router will attempt to minimize the number of collisions, thereby improving the number of defective devices that may be used with the set of implementations.

Figure 15:
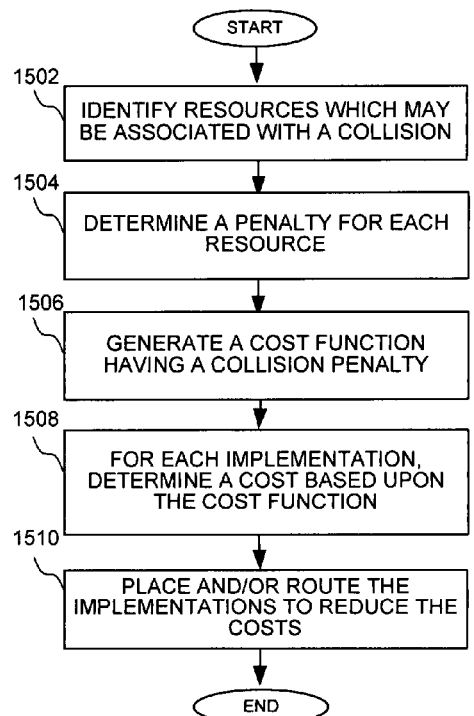
FIG. 15 is a flow chart showing a method of implementing a cost function based upon collisions according to a further alternate embodiment of the present invention.

As shown in the flow chart of FIG. 15, resources which may be associated with a collision are identified at a step 1502. For example, a user may decide to define a collision to include an occurrence when either a lookup table or a BRAM is used by all implementations of the group of implementations. Collision constraints may be used in routing. In a well-known maze-routing algorithm, a collection of PIPs and wire segments is chosen to implement each net. Typically, each PIP and segment has a cost. In some embodiments of the invention, the cost of each PIP and segment includes a collision cost. In other embodiments, the resulting physical route has a delay value, and a delay cost that is dependent on the maximum of all implementations of the net and the minimum of all the implementations of the net. The user will also determine an associated penalty for each resource which may be involved in a collision at a step 1504. A cost function comprising a cost penalty based upon collisions is generated at a step 1506. The cost based upon the cost function is determined for each implementation at a step 1508. In a step 1510, one or more moves are generated and optionally accepted by the optimization algorithm.

Any optimization algorithm may be employed according to the present invention. For example, a "greedy algorithm," "mincut" or "min-cost", or other "hill climbing algorithm", "simulated annealing," "maze routing", "A* routing" or "Pathfinder", all of which are well known in the art of circuit implementation, may be employed. The optimization algorithm enables re-placing and/or re-routing the implementations to reduce the cost. Step 1510 may include evaluating the move using a cost function that includes a collision penalty. Next, a check is done to determine whether or not the optimization algorithm is complete, where the cost is continuously updated. In step 1510, the optimization algorithm may perform only a single move in a single implementation, where all moves may be performed to optimize one implementation before starting on another implementation, as will be described in more detail in reference to FIG. 16. In another embodiment, all implementations are optimized simultaneously, as will be described in more detail in reference to FIG. 17. Optionally, after all implementations are built, the process is iteratively modified, re-optimizing each implementation while the others are unchanging. While a method of generating a plurality of implementations based upon using a cost function having a collision penalty is described in FIG. 15, it should be understood that the plurality of implementations may be generated based upon a cost function not having a collision penalty, as described above.

Figure 16:
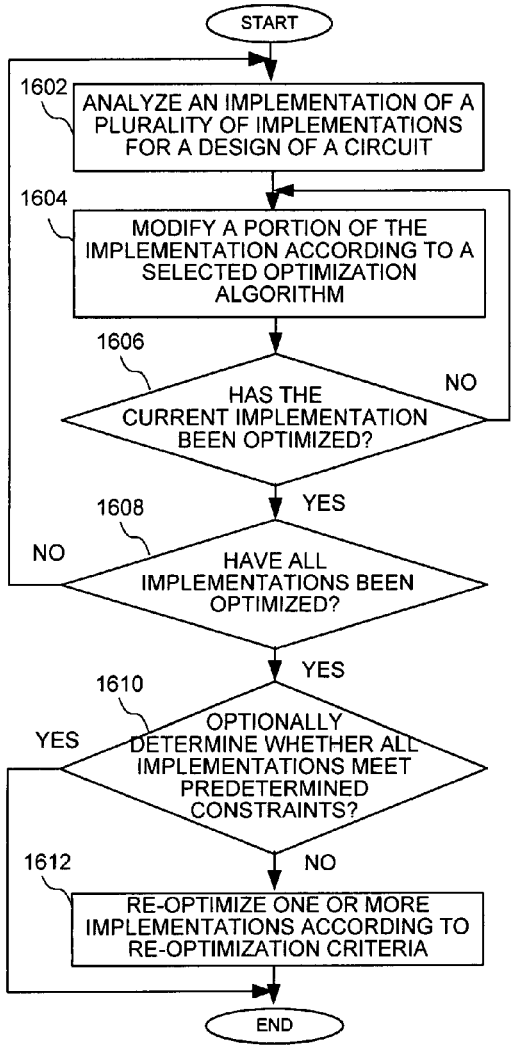
FIG. 16 is a flow chart showing a method of generating a plurality of implementations for a circuit design according to an embodiment of the present invention.

Turning now to FIG. 16, a flow chart shows a method of generating a plurality of implementations for a circuit design according to an embodiment of the present invention. In particular, an implementation of a plurality of implementations is analyzed for a design of a circuit at a step 1602. A portion of the implementation is modified according to a selected optimization algorithm at a step 1604. It is then determined whether the current implementation has been optimized at a step 1606. If not, the remaining portions of the circuit are modified according to the selected optimization algorithm. After the current implementation is optimized, it is then determined whether all of the implementations have been optimized at a step 1608. If not, a new implementation which has not yet been optimized is analyzed. After all of the implementations have been optimized, it is then optionally determined whether all implementations meet predetermined constraints at a step 1610. The predetermined constraints may comprise constraints associated with the cost function, such as resources used, delay requirements or collision requirements, and/or any other constraints that may provide an indication as to the variation between the implementations. If not, one or more implementations are re-optimized at a step 1612. The re-optimization criteria may comprise for example, whether an optimization algorithm has been performed a predetermined number of times, whether the variation between the implementations, such as an absolute difference or percentage difference in any given constraint, is acceptable, and/or some other criteria for determining that the plurality of implementations have been optimized.

Figure 17:
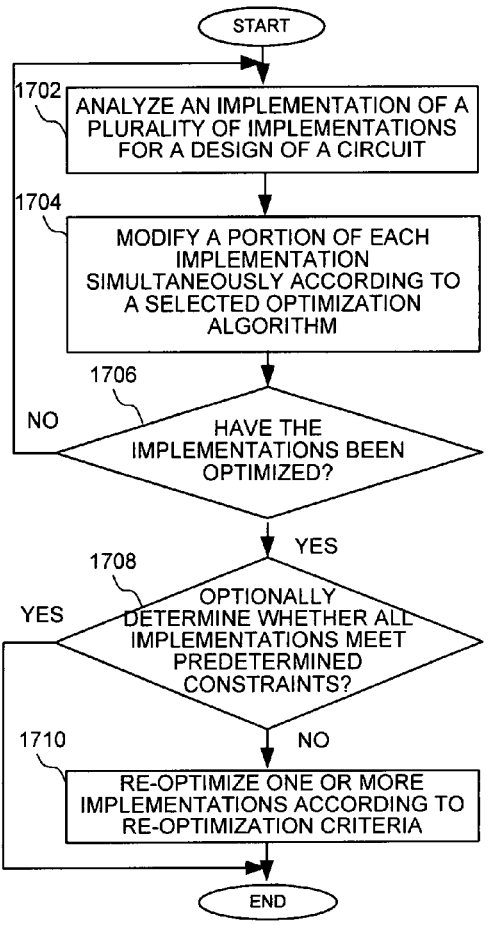
FIG. 17 is a flow chart showing a method of generating a plurality of implementations for a circuit design according to an alternate embodiment of the present invention.

According to the alternate embodiment of FIG. 17, a flow chart shows a method of simultaneously generating a plurality of implementations for a circuit design. In particular, an implementation of a plurality of implementations for a design of a circuit is analyzed at a step 1702. A portion of each implementation is modified simultaneously according to a selected optimization algorithm at a step 1704. It is then determined whether the implementations have been optimized at a step 1706. If so, it is then optionally determined whether all implementations meet predetermined constraints at a step 1708. If not, one or more implementations are then re-optimized at a step 1710.

It should be noted that re-routing the nets may introduce collisions, but that penalties on collisions will tend to eliminate the collisions. A cleanup phase may be implemented, where introduced collisions may be resolved by re-routing nets. Any additional variations introduced by the rerouting may also be resolved. A final phase in the completion of the designs is to analyze all designs together and minimize or eliminate collisions and to minimize variation of net delays. Variation across wafers of approximately 5%-10% is common, and a variation from wafer to wafer in a lot may be approximately 15%, for example. Further, a 15% variation in different speed grades is also common. Therefore, if the delays are limited to approximately 30% variation, the delays would be indistinguishable from the delays of currently manufactured programmable logic devices.

Figure 18:
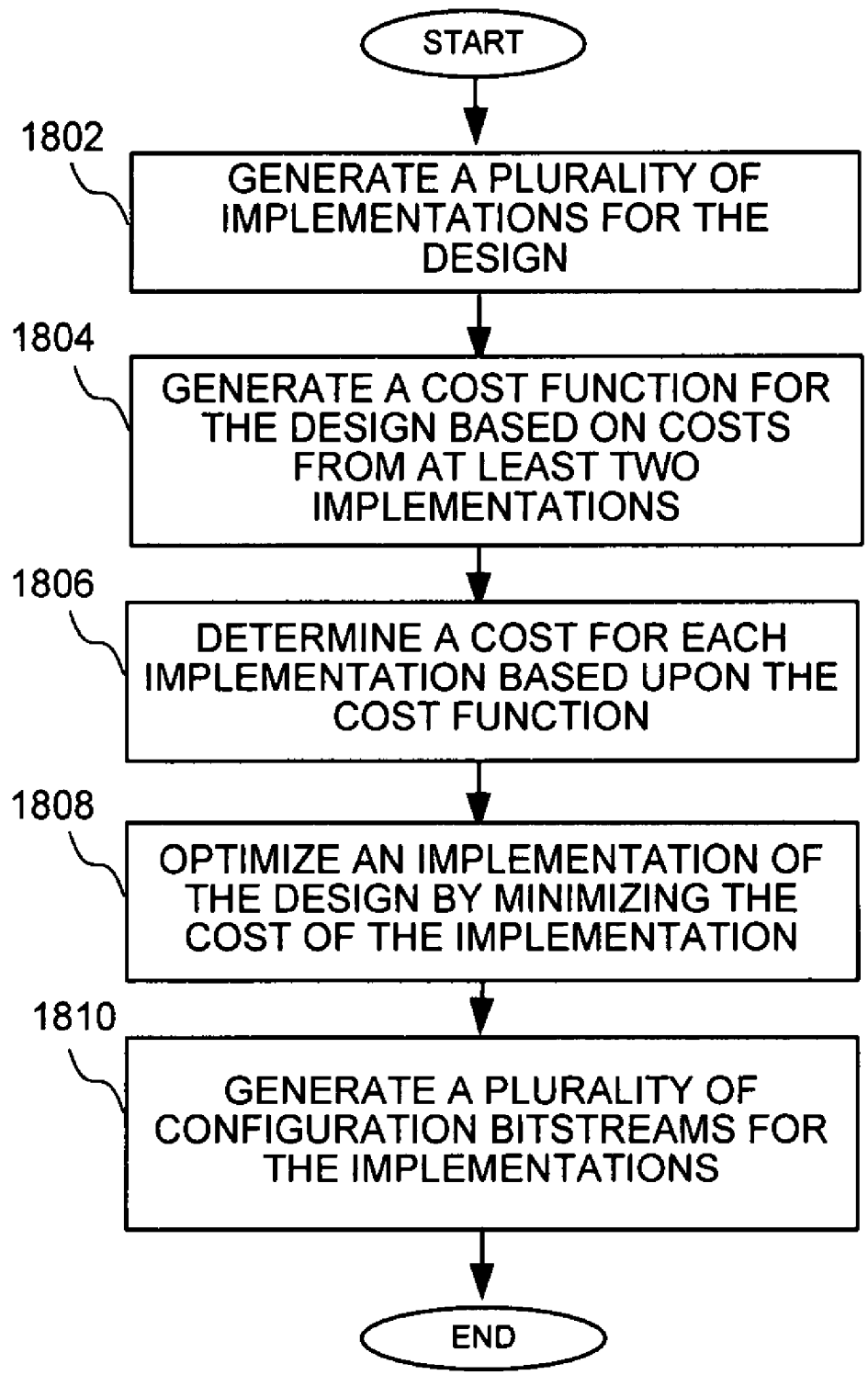
FIG. 18 is a flow chart showing a method of implementing a cost function based on costs derived from at least two implementations according to another embodiment of the invention.

FIG. 18 is a flow chart showing a method of implementing a cost function based on costs derived from at least two implementations of a design. A plurality of implementations for the design are generated in step 1802. A cost function for the design is generated in step 1804, where the cost function is based upon costs derived from at least two of the plurality of implementations. For example, the cost function may be based on collision penalties that are assessed whenever a resource is used in two or more of the implementations. In one embodiment, a collision penalty is assessed on any resource that is used in all of the implementations. A cost is determined for each implementation based upon the cost function in step 1806. An implementation of the design is optimized by minimizing the cost of the implementation in step 1808, e.g., as shown in FIGS. 16 and 17. A plurality of configuration bitstreams for the plurality of implementations is generated in step 1810, and the configuration bitstreams are output (e.g., stored in a memory, passed to another computer program, programmed into a programmable logic device, etc.).

It can therefore be appreciated that new and novel methods of using one of a plurality of configuration bitstreams of a programmable logic device have been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of implementing an integrated circuit using one of a plurality of configuration bitstreams for a design implemented in the integrated circuit, the method comprising:
   generating, by a computer, a plurality of implementations of the design;
   analyzing the plurality of implementations of the design to determine initial variations in timing among the implementations;
   modifying at least one implementation of the plurality of implementations to reduce the variations in timing among the plurality of implementations; and
   outputting a plurality of configuration bitstreams for the plurality of implementations having variations in timing that are reduced relative to the initial variations in timing.

2. The method of claim 1, wherein modifying at least one implementation of the plurality of implementations to reduce the variations in timing among the plurality of implementations comprises iteratively modifying the plurality of implementations to satisfy maximum timing constraints for the design.

3. The method of claim 2, wherein the maximum timing constraints comprise maximum timing constraints on nets of the design.

4. The method of claim 2, wherein the maximum timing constraints comprise maximum timing constraints on paths of the design.

5. The method of claim 1, wherein modifying at least one implementation of the plurality of implementations to limit the variations in timing among the plurality of implementations comprises iteratively modifying the plurality of implementations to satisfy minimum timing constraints for the design.

6. The method of claim 5, wherein the minimum timing constraints comprise minimum timing constraints on nets of the design.

7. The method of claim 5, wherein the minimum timing constraints comprise minimum timing constraints on paths of the design.

8. The method of claim 1, further comprising validating the integrated circuit in a system using a configuration bitstream of the plurality of configuration bitstreams.

9. The method of claim 1, further comprising determining the maximum timing constraints for the design by determining timing constraints on paths between an input and a register.

10. The method of claim 1, further comprising determining the maximum timing constraints for the design by determining timing constraints on paths between a register and an output.

11. The method of claim 1, further comprising iteratively modifying, for each implementation of the plurality of implementations, the design toward minimum timing constraints.

12. The method of claim 11, further comprising determining the minimum timing constraints by determining minimum timing constraints on nets of the design.

13. The method of claim 11, further comprising determining the minimum timing constraints by determining minimum timing constraints on paths of the design.

14. The method of claim 1, further comprising generating a cost function for the design, the cost function being based upon costs derived from at least two implementations of the plurality of implementations.

15. The method of claim 14, further comprising determining a cost for each implementation of the plurality of implementations based upon the cost function.

16. The method of claim 15, further comprising optimizing an implementation of the plurality of implementations by minimizing the cost of the implementation.

17. The method of claim 1, further comprising generating a cost function having a collision penalty.

18. The method of claim 17, wherein generating the cost function having the collision penalty comprises generating the cost function having the collision penalty based upon collisions for resources used by each implementation of the plurality of implementations.

19. The method of claim 18, further comprising designating resources of the integrated circuit that may be associated with a collision in the cost function.

20. The method of claim 1, wherein generating the cost function comprises generating the cost function based upon at least one of a delay penalty and a resource penalty.

* * * * *